(12) United States Patent  (10) Patent No.: US 8,999,824 B2
Noguchi et al.  (45) Date of Patent: Apr. 7, 2015

(54) METHOD FOR MANUFACTURING SEMICONDUCTOR DEVICE BY PERFORMING MULTIPLE ION IMPLANTATION PROCESSES

(71) Applicant: Fuji Electric Co., Ltd., Kawasaki (JP)

(72) Inventors: Seiji Noguchi, Matsumoto (JP); Hidenao Kuribayashi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 14/302,103

(22) Filed: Jun. 11, 2014

(65) Prior Publication Data

US 2014/0377942 A1  Dec. 25, 2014

(30) Foreign Application Priority Data

Jun. 25, 2013 (JP) ................................. 2013-133211

(51) Int. Cl.
*H01L 21/425* (2006.01)
*H01L 21/266* (2006.01)
*H01L 21/324* (2006.01)

(52) U.S. Cl.
CPC ............ *H01L 21/266* (2013.01); *H01L 21/324* (2013.01)

(58) Field of Classification Search
None
See application file for complete search history.

(56) References Cited

U.S. PATENT DOCUMENTS 4,900,688 A * 2/1990 Halvis ............................ 438/144
6,080,614 A * 6/2000 Neilson et al. ................ 438/238
2005/0017290 A1   1/2005 Takahashi et al.
2011/0250728 A1  10/2011 Yamashita et al.
2013/0119432 A1 *  5/2013 Lu .................................. 257/139

FOREIGN PATENT DOCUMENTS

| JP | 62-195119 A | 8/1987 |
|---|---|---|
| JP | 07-105902 A | 4/1995 |
| JP | 08-031764 A | 2/1996 |
| JP | 09-246241 A | 9/1997 |
| JP | 10-106967 A | 4/1998 |
| JP | 11-008303 A | 1/1999 |
| JP | 11-017087 A | 1/1999 |
| JP | 11-162936 A | 6/1999 |
| JP | 2002-299278 A | 10/2002 |
| JP | 2003-045858 A | 2/2003 |
| JP | 2004-158691 A | 6/2004 |
| JP | 2005-057235 A | 3/2005 |
| JP | 2006-019556 A | 1/2006 |
| JP | 2009-158922 A | 7/2009 |
| JP | 2010-010400 A | 1/2010 |
| JP | 2011-222660 A | 11/2011 |

* cited by examiner

*Primary Examiner* — Charles Garber
*Assistant Examiner* — Brigitte Paterson
(74) *Attorney, Agent, or Firm* — Rossi, Kimms & McDowell LLP

(57) ABSTRACT

A method for manufacturing a semiconductor device suppresses loss of vacuum in a chamber of an ion implanter, sag of a resist mask pattern for ion implantation, and producing a resist residue after ashing. First ion implanting process implants n-type impurity to form $n^+$ impurity layer on the whole back surface of $n^-$ semiconductor wafer. A resist mask on the back surface of the wafer covers a part corresponding to where $n^+$ cathode layer will be formed. A second ion implanting process implants p-type impurity using the resist mask to form $p^+$ impurity layer in the interior of the $n^+$ impurity layer. Second ion implanting process is split into two or more times. The dose of p-type impurity in second ion implanting process is greater than that of n-type impurity in first ion implanting process. The resist mask is removed, and $p^+$ the $n^+$ impurity layers activated.

11 Claims, 4 Drawing Sheets

METHOD FOR MANUFACTURING SEMICONDUCTOR DEVICE BY PERFORMING MULTIPLE ION IMPLANTATION PROCESSES

BACKGROUND OF THE INVENTION

A. Field of the Invention

The present invention relates to a method for manufacturing a semiconductor device.

B. Description of the Related Art

Conventionally, power semiconductor devices, which are represented by a FWD (free-wheeling diode), an IGBT (insulated gate bipolar transistor), and a MOSFET (insulated gate field effect transistor), have generally vertical structures in which impurity layers and electrodes are formed on a semiconductor chip not only at the front surface side but also at the back surface side. Vertical semiconductor devices are normally manufactured so that a semiconductor wafer is ground at the back surface to thin and then one impurity layer is formed as a back surface element structure on the whole back surface of the semiconductor wafer that has been ground after, or on the way of forming, a front surface element structure on the front surface side thereof.

On the other hand, a reverse conducting IGBT (RC-IGBT) integrated by including an IGBT and a FWD in the same semiconductor chip comprises two impurity layers in which the conductivity types are different to each other at the back surface side of the semiconductor chip. The two impurity layers are disposed in parallel as the back surface element structure in the horizontal direction to the principal surface of the chip. Then, the RC-IGBT requires that the back surface of a semiconductor wafer is ground to thin, and then each of ion implanting processes is performed to form the two impurity layers with different conductivity types to each other on the back surface which has been ground of the semiconductor wafer.

As a method for forming the back surface element structure of the RC-IGBT, it is known that the method includes the following processes. A resist mask covers one part corresponding to one region where one of the two impurity layers with different conductivity types to each other is formed, and then implanting ions can form the other impurity layer at the other part, where exposed at the opening of the resist mask, corresponding to the region where the other impurity layer should be formed. These processes are repeated twice by changing a part covered by the resist mask and a conductivity type of the impurity which will be implanted. This raises a problem of increase in manufacturing costs owing to patterning processes of two times for forming resist masks.

As another method for forming the back surface element structure of the RC-IGBT, it is known that the method includes the following processes. One of the two impurity layers with different conductivity types to each other is formed on the whole back surface of the semiconductor wafer. Then a resist mask covers one part of the region where one impurity layer has been formed. Implanting ions inverts one conductivity type of the other part, where exposed at the opening of the resist mask, corresponding to the region where the other impurity layer will be formed, forming the other impurity layer. This method can reduce the patterning process for forming resist mask to one time.

Japanese Unexamined Patent Application Publication No. 2005-057235, No. 2009-158922, No. 2006-019556, and No. 2011-222660, referred to herein as "Patent Documents 1 to 4," respectively, describe two kinds of methods in which the patterning process for forming resist mask can be reduced to one time for forming the back surface element structure. The first method provides that a p-type impurity layer is formed on the whole back surface of the semiconductor wafer, and then an n-type impurity layer is selectively formed using a resist mask as a mask after patterning for forming the resist mask. The second method provides that an n-type impurity layer is formed on the whole back surface of the semiconductor wafer, and then a p-type impurity layer is selectively formed using a resist mask as a mask after patterning for forming the resist mask.

The first method provides that performing an ion implanting process of an n-type impurity inverts a part of the p-type impurity layer which has been formed earlier, forming the n-type impurity layer. FIGS. 6 to 8 are sectional views illustrating stages on the way of manufacturing a conventional semiconductor device. Specifically, the first method provides that implanting ions of boron (B) 121 can form a $p^+$ impurity layer 111a on the whole back surface of an $n^-$ semiconductor wafer 101 (FIG. 6). Next, implanting ions of phosphorous (P) 123 on the back surface of the $n^-$ semiconductor wafer 101 using a resist mask 122 as a mask inverts a part of the $p^+$ impurity layer 111a to that of n-type, forming an $n^+$ impurity layer 112a (FIG. 7).

Afterward, activating the $p^+$ impurity layer 111a and the $n^+$ impurity layer 112a through heat treatment can form a $p^+$ collector layer 111 and an $n^+$ cathode layer 112, respectively (FIG. 8). The second method, in contrast to the first method, provides that, after forming an $n^+$ impurity layer on the whole back surface of the $n^-$ semiconductor wafer, implanting ions of a p-type impurity inverts a part of the $n^+$ impurity layer formed previously to the p-type, forming a $p^+$ impurity layer. In both of the first and the second methods, the second ion implanting process (referred as high dose ion implantation in the following) using a resist mask is carried out with a high dose to invert the impurity layer with different conductivity type.

Then, on the ion implanting process using the resist mask as described above, loss of vacuum in a chamber of an ion implanter might occur during ion implantation. The reason is as follows. The temperature of the wafer rises owing to kinetic energy which the resist mask has received in collisions with impurity ions, and then organic solvent components constituting the resist mask are vaporized. Thus gas is emitted (so-called degassing) in the chamber. Further, so-called "sag" of a pattern, which corresponds to deformation of a resist pattern, is generated owing to the rise in temperature of the wafer. This causes the thickness of external periphery of the resist mask to become thinner partially. Thus an impurity ion implanted is liable to penetrate through a thinner part of the resist mask.

Japanese Unexamined Patent Application No. 08-031764, referred to herein as "Patent Document 5," describes an ion implanter which can suppress degassing including an air-lock chamber with its inside state selectively switched between a vacuum state and an atmospheric state by using a vacuum exhaust measure and a ventilation measure, wherein the air-lock chamber is disposed adjacent to an implantation chamber; and a light source for irradiating the surface of processing object in the air-lock chamber. Furthermore, Japanese Unexamined Patent Application No. 07-105902, referred to herein as "Patent Document 6," describes an ion implanter that can prevent a deformation of the resist pattern. The ion implanter includes a temperature sensor disposed on a platen which places a wafer; and a controller for scanning ion beam only when a temperature detected by the temperature sensor is within the setting condition.

Further, the temperature of the semiconductor wafer rises during ion implantation. Heating to cure the surface layer of the resist mask forms a deteriorated layer thereon. Thus a resist residue might be produced when the resist mask could not be removed perfectly. The deteriorated layer, which is formed by curing the surface layer of the resist mask, has an extremely lower ashing rate than normal resist, so this causes the resist residue to occur. As a method to remove a resist mask used for ion implantation without any residue, Japanese Unexamined Patent Application No. 2003-045858, referred to herein as "Patent Document 7," describes a method for removing the resist mask after a process for injecting ions of a conductive type impurity element and ions of a rare gas element simultaneously.

Another method to remove a resist mask used for ion implantation without any residue is disclosed in Japanese Unexamined Patent Application No. 2010-010400, referred to herein as "Patent Document 8." It describes a method in which, after a processing wafer is baked under normal pressure in order to remove a resist cured by ion implantation, for example, the processed wafer is subjected to plasma ashing processing in a high temperature area at about 300° C. in an oxygen single gas atmosphere composed of an oxygen gas substantially. Also, as a method to remove a resist mask without deterioration, Japanese unexamined Patent Application No. 11-162936, referred to herein as "Patent Document 9," describes a method in which a light-ashing performed in a pre-asher room, a main ashing performed in a post-ashing room, and also an after light ashing in the pre-asher room are separately conducted each other. By the above ashing of three times, a high peeling off characteristic to the resist and a high processing ability to an apparatus are given.

However, the thinner the thickness of the semiconductor wafer becomes, the worse the radiation of heat becomes. Then a rise in temperature of a semiconductor wafer, which occurs due to the kinetic energy which a resist mask has received during ion implantation, become more remarkable. Patent Documents 5 to 9 do not refer to application for a semiconductor device having withstand voltage equal to or less than 2000 V (Withstand voltage≈Thickness of the n⁻ semiconductor substrate×10), namely, a thin semiconductor wafer having a thickness equal to or less than 200 μm, for example. Then the temperature might rise during ion implantation for the thin semiconductor wafer equal to or less than 200 μm in thickness.

In the case of a rising in temperature of the semiconductor wafer during ion implantation, as described above, degassing occurs from the resist mask, and then a vacuum level will drop in a chamber of an ion implanter. Thus an action might be handled by the ion implanter as an emergency, requiring operator intervention such as maintenance, and then the ion implanting process might be interrupted. Further, the rise in temperature of the semiconductor wafer causes loss of vacuum in the chamber of the ion implanter. Thus a variation of dose for ion implantation might increase.

Moreover, the rise in temperature of the semiconductor wafer during ion implantation causes an organic solvent element constituting the resist mask to bump and then to scatter by spouting from the inside of the resist mask (foaming from the resist mask). Thus contaminations such as particles are liable to stick on the semiconductor wafer. Further, the rise in temperature of the semiconductor wafer during ion implantation causes the resist mask pattern to sag. Then the ion implanting process can not be performed by using desired resist pattern. Thus owing to problems encountered by the rise in temperature of the semiconductor wafer, yield may decrease.

Loss of vacuum and the sag of the resist mask pattern during ion implantation become more remarkable for the first method than for the second method as described above. The reason is that the kinetic energy which resist mask has received is larger for the first method which inverts the impurity layer from p-type to n-type by implanting ions of the n-type impurity such as phosphorus (P), arsenic (As), and antimony (Sb), which have higher mass number than the p-type impurity, in comparison with the second method which inverts the impurity layer from n-type to p-type by implanting ions of the p-type impurity such as boron (B).

Further, the higher the dose in ion implantation is, the more remarkable the loss of vacuum and the sag of the resist mask pattern become during ion implantation. Specifically, for the first method, high dose ion implantation is performed using an n-type impurity with a high dose equal to or greater than $1.0 \times 10^{15}$ cm$^{-2}$, for example. Decreased beam current during ion implantation can suppress the loss of vacuum and the sag of the resist mask pattern. However, this raises a problem of lowering throughput.

As a measure to suppress the loss of vacuum and the sag of the resist mask pattern, normally curing through ultraviolet irradiation and baking through heat treatment are conducted for the resist mask which has been patterned before implanting ions using the resist mask as a mask. However, as described above, in the case of a thin semiconductor wafer, the rise in temperature of the semiconductor wafer becomes remarkable. Then there is a risk that the loss of vacuum in the chamber and the sag of the resist mask pattern cannot be suppressed.

In the case that an impurity having higher mass number is implanted by high dose ion implantation with a higher dose, a resist residue also increases when ashing. The reason is that the higher the mass number of the impurity implanted is, the greater the damage given to the resist mask becomes, and then the greater the thickness of the deteriorated layer becomes. Moreover, when subsequent processes are continued under the state that the resist residue has been produced, the resist residue causes the semiconductor wafer to be contaminated in the subsequent processes. In addition, the resist residue is liable to cause so-called "cross-contamination" that the processing equipment is contaminated and then the other semiconductor wafer will be also contaminated. This raises a problem of lowering yields of the semiconductor wafers not only for the wafer on which the resist residue has been produced, but also for the other.

The present invention is directed to overcoming or at least reducing the effects of one or more of the problems set forth above.

SUMMARY OF THE INVENTION

In order to solve the problems in the conventional art described above, the present invention provides a method for manufacturing a semiconductor device that is able to suppress loss of vacuum in a chamber of an ion implanter. In order to solve the problems in the conventional art described above, the present invention further provides a method for manufacturing a semiconductor device that is able to suppress sag of a resist mask pattern used for ion implantation. In order to solve the problems in the conventional art described above, the present invention also provides a method for manufacturing a semiconductor device that is able to suppress producing a resist residue.

According to the present invention, there is provided a method for manufacturing a semiconductor device comprising the steps of: performing a first ion implanting process for implanting an n-type impurity with a first dose on a surface of a semiconductor wafer to form an n-type impurity layer on the surface of the semiconductor wafer; coating resist on the surface of the side where the n-type impurity layer is formed in the semiconductor wafer; exposing the semiconductor wafer selectively for patterning the resist; and performing a second ion implanting process for implanting a p-type impurity with a second dose greater than the first dose using the remaining part of the resist as a mask to form a p-type impurity layer in the interior of the n-type impurity layer.

According to the present invention described above, there is also provided the method for manufacturing a semiconductor device, wherein the second ion implanting process, which is split into two or more times, is performed until the dose of the p-type impurity reaches the second dose, wherein each dose of the ion implanting processes split into two or more times is less than the second dose.

According to the present invention above, there is further provided the method for manufacturing a semiconductor device, wherein $R_p1$, $\Delta R_p1$, $R_p2$, and $\Delta R_p2$ are defined as the projected range of the n-type impurity in the first ion implanting process, the standard deviation of the projected range $R_p1$, the projected range of the p-type impurity in the second ion implanting process, and the standard deviation of the projected range $R_p2$, respectively, wherein the following equation 1 is satisfied as:

$$R_p2+3\cdot\Delta R_p2 \geq R_p1+3\Delta R_p1 \quad (1)$$

The method preferably further includes heat treatment to activate the n-type impurity layer and the p-type impurity layer after the second ion implanting process, wherein N1, N2, xj1, and xj2 are defined as the first dose, the second dose, the diffusion depth of the n-type impurity layer after heat treatment, and the diffusion depth of the p-type impurity layer after heat treatment, respectively, wherein the following equation 2 is satisfied as:

$$N2 > N1 \cdot (xj2/xj1) \quad (2)$$

According to the present invention the second dose of the p-type impurity layer preferably is equal to or greater than $1.0 \times 10^{15}$ cm$^{-2}$.

The method can further include a thinning process grinding a principal surface of the semiconductor wafer to reduce the thickness of the semiconductor wafer before the first ion implanting process, wherein the thinning process allows the thickness of the semiconductor wafer to decrease to 200 μm or less, wherein the first ion implanting process implants the n-type impurity on the surface of the semiconductor wafer which has been ground.

According to the present invention described above, the method includes the steps of: forming an n-type impurity layer, implanting ions of a p-type impurity having smaller mass number than that of the n-type impurity by using a resist mask, and forming the p-type impurity layer by inverting a part of the n-type impurity layer into the p-type. This method can lower the kinetic energy which the resist mask used for ion implantation has received, in comparison with the case of inverting the p-type impurity layer to the n-type by implanting ions of the n-type impurity. This can suppress the rise in temperature of the semiconductor wafer owing to ion implantation.

Further, according to the present invention described above, splitting the ion implanting process of the p-type impurity using the resist mask into two or more times enables the dose implanted by each ion implanting process of the p-type impurity to be less than the second dose implanted into the p-type impurity layer at the final stage. Then this allows the kinetic energy which the resist mask has received to be reduced further. This can furthermore suppress the rise in temperature of the semiconductor wafer owing to ion implantation, even if the ion implanting process of the p-type impurity is high dose ion implantation, in which the dose is $1.0 \times 10^{15}$ cm$^{-2}$ or more, and even if the thickness of the semiconductor wafer is as thin as 200 μm or less.

Moreover, according to the present invention described above, suppressing the rise in temperature of the semiconductor wafer owing to ion implantation can suppress the sag of the resist mask pattern. This eliminates the need to conduct curing or baking, for example, for the resist mask patterned. Further, the impurity ion impacting on the resist mask is p-type, which has a lower mass number than n-type, so this can minimize the damage given to the resist mask. Thus this can reduce the thickness of the deteriorated layer formed by curing the surface layer of the resist mask.

According to the method for manufacturing the semiconductor device of the present invention, there is provided an effect that can suppress loss of vacuum in a chamber of an ion implanter. Further, according to the method for manufacturing the semiconductor device of the present invention, there is provided an effect that can suppress sag of a resist mask pattern used for an ion implanting process. Furthermore, according to the method for manufacturing the semiconductor device of the present invention, there is provided an effect that can suppress producing a resist residue.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
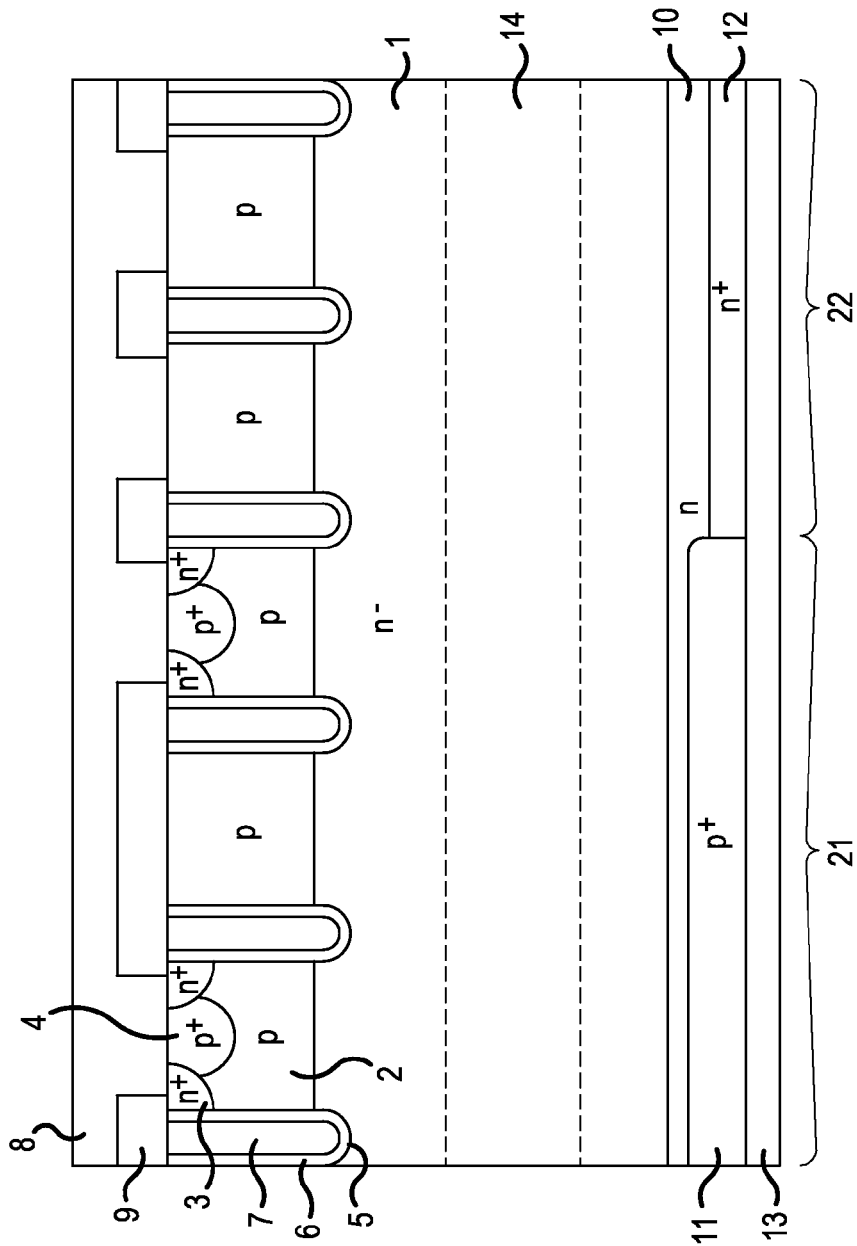
FIG. 1 is a sectional view illustrating a configuration of a semiconductor device manufactured by a method for manufacturing a semiconductor device according to an embodiment of the present invention.

Referring to accompanying figures in the following, a preferred embodiment of a method for manufacturing semiconductor device according to the present invention will be described in detail. In the present description and the accompanying figures, "n" and "p" prefixed to layers and regions indicate that the majority carrier is an electron and a hole, respectively. "+" and "−" appended to an "n" or a "p" indicate that the impurity concentration is higher and lower, respectively, than layers and regions without "+" and "−". In addition, according to the description of the embodiment and the accompanying figures, the same reference numerals are given to like components and redundant descriptions are omitted.

Embodiment

Configurations of a semiconductor device manufactured by a method for manufacturing a semiconductor device of an embodiment will be described. FIG. 1 is a sectional view illustrating a configuration of a semiconductor device manufactured by a method for manufacturing a semiconductor device according to an embodiment of the present invention. As shown in FIG. 1, the semiconductor device according to the embodiment includes an insulated gate bipolar transistor (IGBT) portion 21 where an IGBT is disposed, and a freewheeling diode (FWD) portion 22 where a FWD is disposed on the same n− semiconductor substrate (semiconductor chip), which corresponds to an n− drift layer 1. Namely, the semiconductor device according to the embodiment shown in FIG. 1 is a reverse conducting IGBT (RC-IGBT) in which the FWD of the FWD portion 22 is connected to the IGBT of the IGBT portion 21 in inversely parallel fashion.

In the IGBT portion 21, a MOS gate (insulated gate including metal-oxide-semiconductor) structure with the general trench-gate including a p-base layer 2, an n+ emitter region 3, a p+ contact region 4, a trench 5, a gate oxide 6, and a gate electrode 7 is disposed at the front surface layer of an n− semiconductor substrate. The thickness of the n− semiconductor substrate may be as thin as 10 μm or more and 200 μm or less, for example. The reason is that, along with the effect obtained according to the present invention, an electrical loss can be reduced when withstand voltage is in the range of about 100 to 2000 V (Withstand voltage≈Thickness of the n− semiconductor substrate×10). The effect according to the present invention becomes remarkable moreover when the thickness of the n− semiconductor substrate is equal to or less than 150 μm (withstand voltage equal to or less than 1500 V).

An emitter electrode 8, which contacts the n+ emitter region 3 and the p+ contact region 4, is electrically insulated from the gate electrode 7 by an interlayer insulating film 9. The p-base layer 2, the trench 5, the emitter electrode 8, and the interlayer insulating film 9 are disposed throughout from the IGBT portion 21 to FWD portion 22. The FWD portion 22 eliminates the n+ emitter region 3 and the p+ contact region 4. Namely, the p-base layer 2, the trench 5, the emitter electrode 8, and the interlayer insulating film 9 are disposed in the FWD portion 22 like in IGBT portion 21 at the front surface layer of the n− semiconductor substrate.

The p-base layer 2 works as an anode in the FWD portion 22. The emitter electrode 8 contacts the p-base layer 2, and serves as the anode electrode. In the interior of the n− drift region 1, an n-field-stop (FS) layer 10 is located in the back side of the n− semiconductor substrate in order to prevent a depletion layer, which extends from a pn junction between the n− drift layer 1 and the p-base layer 2 when turning off, from reaching the p+ collector layer 11. Further, the region in which the carrier lifetime is shorter than that of the other region (short lifetime region, in the following) 14 is disposed in the interior of the n− drift layer 1.

At the back surface layer of the n− semiconductor substrate, the p+ collector layer 11 is disposed in the IGBT portion 21, and the n+ cathode layer 12 is disposed in the FWD portion 22. The p+ collector layer 11 and the n+ cathode layer 12 are disposed side by side in the horizontal direction to the principal surface of the n− semiconductor substrate. The diffusion depth of the p+ collector layer 11 is greater than that of the n+ cathode layer 12. Namely, the thickness of the p+ collector layer 11 is greater than that of the n+ cathode layer 12. The impurity concentration of the p+ collector layer 11 may be lower than that of the n+ cathode layer 12. A collector electrode 13 is in contact with the p+ collector layer 11. Further, the collector electrode 13, which serves as the cathode electrode, is in contact with the n+ cathode layer 12.

Figure 2:
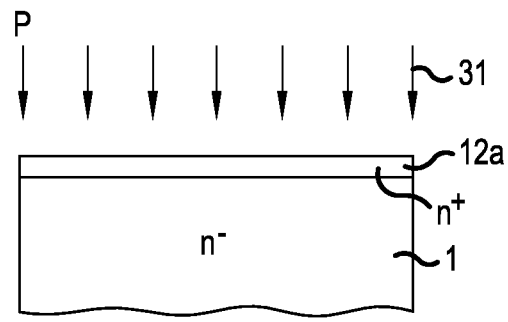
FIG. 2 is a sectional view illustrating a state on the way of manufacturing the semiconductor device schematically according to the embodiment of the present invention.
Figure 3:
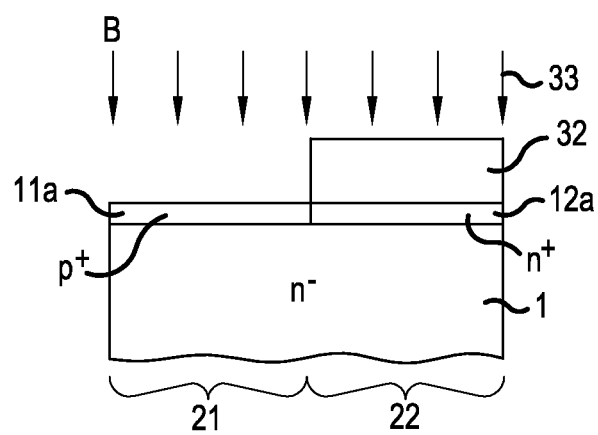
FIG. 3 is a sectional view illustrating another state on the way of manufacturing the semiconductor device schematically according to the embodiment of the present invention.
Figure 4:
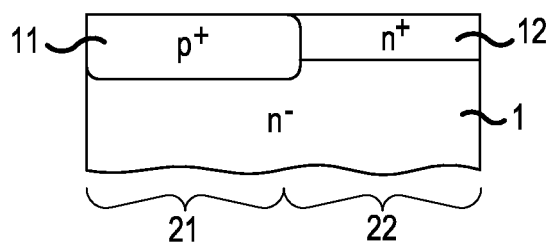
FIG. 4 is a sectional view illustrating still another state on the way of manufacturing the semiconductor device schematically according to the embodiment of the present invention.

Next, the method for manufacturing the semiconductor device according to the embodiment will be described. FIGS. 2 to 4 are cross sectional views illustrating schematically stages in manufacturing the semiconductor device according to the embodiment. In FIGS. 2 to 4, each illustration of the front surface structure for the RC-IGBT is omitted. At first, using the general method, the emitter electrode 8, the interlayer insulating film 9, and the MOS gate structure with the trench-gate including the p-base layer 2, the n+ emitter region 3, the p+ contact region 4, the trench 5, the gate oxide 6, and the gate electrode 7, for example, are formed on the front surface side of the n− semiconductor wafer (n− semiconductor wafer 1 in the following), which corresponds to the n− drift layer 1. Next, resist (not shown), for example, can protect the front surface where the MOS gate structure and the like are formed in the n− semiconductor wafer 1.

Grinding the n− semiconductor wafer 1 at the back surface can thin until about 150 μm in thickness, for example, (thinning). An n-type impurity layer, which turns to the n-FS layer 10, is formed in the interior of the n− semiconductor wafer 1. As shown in FIG. 2, performing a first ion implanting process 31 for implanting an n-type impurity such as phosphorus (P), arsenic (As), and antimony (Sb) can form an n+ impurity layer 12a on the whole back surface of the n− semiconductor wafer 1. The n+ impurity layer 12a is the region which turns into an n+ cathode layer 12 through thermal diffusion described later. The first ion implanting process 31 may have, for example, a dose of about $2.0 \times 10^{14}$ cm$^{-2}$ to $1.0 \times 10^{15}$ cm$^{-2}$, and acceleration energy of about 60 to 80 keV.

On the back surface of the n− semiconductor wafer 1, a resist film is formed and patterned. The resist film of one part (IGBT portion 21), which corresponds to the region where the p+ collector layer 11 will be formed, is removed. As shown in FIG. 3, this causes exposure of the one part which corresponds to the region where the p+ collector layer 11 will be formed, forming a resist mask 32 covering the other part (FWD portion 22) which corresponds to the region where the n+ cathode layer 12 will be formed. Performing a second ion implanting process 33 for implanting a p-type impurity such as boron (B) using the resist mask 32 as a mask inverts a part of the n+ impurity layer 12a to the p-type. This can form a p+ impurity layer 11a in the interior of the n+ impurity layer 12a. The p+ impurity layer 11a is the region which will turn to the p+ collector layer 11 through thermal diffusion described later.

The dose of the p-type impurity in the second ion implanting process 33 is higher than that of the n-type impurity in the first ion implanting process 31, and equal to or more than $1.0 \times 10^{15}$ cm$^{-2}$. Specifically, the second ion implanting process 33 may have, for example, a dose at the final stage of about $1.0 \times 10^{15}$ cm$^{-2}$ to $3.0 \times 10^{15}$ cm$^{-2}$, and acceleration energy of about 30 to 70 keV. The acceleration energy of the first and the second ion implanting processes 31, 33 is set so that the diffusion depth xj2 of the p+ collector layer 11 is greater than the diffusion depth xj1 of the n+ cathode layer 12.

A method for setting the dose and the acceleration energy of the first and the second ion implanting processes 31, 33 will be described specifically.

The second ion implanting process 33 is preferably conducted by splitting into two or more times. At this time, on the ion implanting process performed by splitting into two or more times ("split ion implantation," in the following), the dose for each ion implanting process is less than the dose of the second ion implanting process 33 at the final stage described above. Split ion implantation, which is split into two or more times, is conducted repeatedly until the dose of the p-type impurity which will be implanted into the n+ impurity layer 12a reaches the dose of the second ion implanting process 33 at the final stage. Splitting the second ion implanting process 33 into two or more times can suppress a rise in temperature of the n− semiconductor wafer 1 when conducting the second ion implanting process 33.

Timing for repeating split ion implantation is changeable variously. Split ion implantation, for example, while observing a temperature of the n− semiconductor wafer 1 every time, may be conducted continuously on one n− semiconductor wafer 1. Further, split ion implantation, while getting the n− semiconductor wafer 1 into and out of a chamber every time, may be conducted continuously on one n− semiconductor wafer 1. Furthermore, two pieces or more of n− semiconductor wafers 1 make one unit, and split ion implantation conducted in turn for a plurality of the n− semiconductor wafers 1 in one unit may be conducted repeatedly for a plurality of the n− semiconductor wafers 1 in another unit.

Next, the resist mask 32 is removed by ashing. Performing wet processes using SC-1 solution (mixed solution of $NH_4OH$, $H_2O_2$ and $H_2O$), sulfuric acid/hydrogen peroxide mixture (mixed solution of $H_2SO_4$ and $H_2O_2$), and the like can remove a resist residue or the like. Next, heat treatment can activate the impurities implanted into the n− semiconductor wafer 1, namely, the p+ impurity layer 11a, the n+ impurity layer 12a, and the n-type impurity layer which will turn to the n-FS layer 10. At this time, the p+ impurity layer 11a diffuses also to the lateral direction (the direction in parallel to the principal surface of the substrate). Then the patterning process described above for forming the resist mask 32 should be conducted in consideration of also lateral diffusion for the p+ impurity layer 11a.

As shown in FIG. 4, heat treatment can form the p+ collector layer 11 and the n+ cathode layer 12 with the depth corresponding to the dose of the impurity. Moreover, along with the p+ collector layer 11 and the n+ cathode layer 12, the n-FS layer 10 is formed at a deeper position than the p+ collector layer 11 and the n+ cathode layer 12. Ions of a light element such as helium and proton are irradiated over the whole back surface with the predetermined range from the back surface of the n− semiconductor wafer 1, forming a defect layer (short lifetime region 14) in the interior of the n− semiconductor wafer 1. The n-FS layer 10 and the short lifetime region 14 are not shown in FIG. 4. The formation of the collector electrode 13 over the whole back surface of the n− semiconductor wafer 1 using a conventional method completes the RC-IGBT shown in FIG. 1.

A method for setting the dose of the first and the second ion implanting processes 31, 33 will be described specifically. The dose N1 of the n-type impurity in the first ion implanting process 31 and the dose N2 of the p-type impurity in the second ion implanting process 33 are set so as to satisfy the equation 3 in the following. The xj1 stands for the diffusion depth of the n+ cathode layer 12. The xj2 stands for the diffusion depth of the p+ collector layer 11.

$$N2 > N1 \cdot (xj2/xj1) \quad (3)$$

The dose N2 of the p-type impurity in the second ion implanting process 33 will be specifically calculated using the equation 3, when employing phosphorous as the dopant (n-type impurity) for the first ion implanting process 31 and boron as the dopant (p-type impurity) for the second ion implanting process 33 and then performing thermal diffusion for one hour at a temperature of 900° C. On this condition, the diffusion depth xj2 of the p+ collector layer 11, in which boron is diffused, is about 0.5 μm. The diffusion depth xj1 of the n+ collector layer 12, in which phosphorus is diffused, is 0.35 μm. Therefore when the dose of the first ion implanting process 31 is $5.0 \times 10^{14}$ cm$^{-2}$, the dose N2 of the p-type impurity in the second ion implanting process 33 must be greater than $7.14 \times 10^{14}$ cm$^{-2}$, which is calculated nearly equal from $5.0 \times 10^{14}$ cm$^{-2}$ times (0.5/0.35), based on the equation 3. If the peak concentration of the p+ collector layer 11 at the final stage is about $1.0 \times 10^{18}$ cm$^{-3}$, the dose N2 of the p-type impurity in the second ion implanting process 33 may be $8.2 \times 10^{14}$ cm$^{-2}$ by adding $1.0 \times 10^{14}$ cm$^{-2}$ of dose in addition to the above calculated value.

Moreover, acceleration energies of the first and the second ion implanting processes 31, 33 will be set to satisfy the equation 4 in the following if $(R_p1+3 \cdot \Delta R_p1)$ and $(R_p2+3 \cdot \Delta R_p2)$ are defined as the range of the n-type impurity in the first ion implanting process 31 and the range of the p-type impurity in the second ion implanting process 33, respectively. The range $(R_p+3 \cdot \Delta R_p)$ of an impurity implanted is given as the sum of $R_p$, which is defined as the projected range of the impurity implanted, and the difference (about three times the standard deviation of the projected range written as "$+3 \cdot \Delta R_p$") between $R_p$max and $R_p$, those are defined as the maximum range of the impurity implanted and the projected range, respectively.

$$R_p2+3 \cdot \Delta R_p2 \geq R_p1+3 \cdot \Delta R_p1 \quad (4)$$

Figure 5:
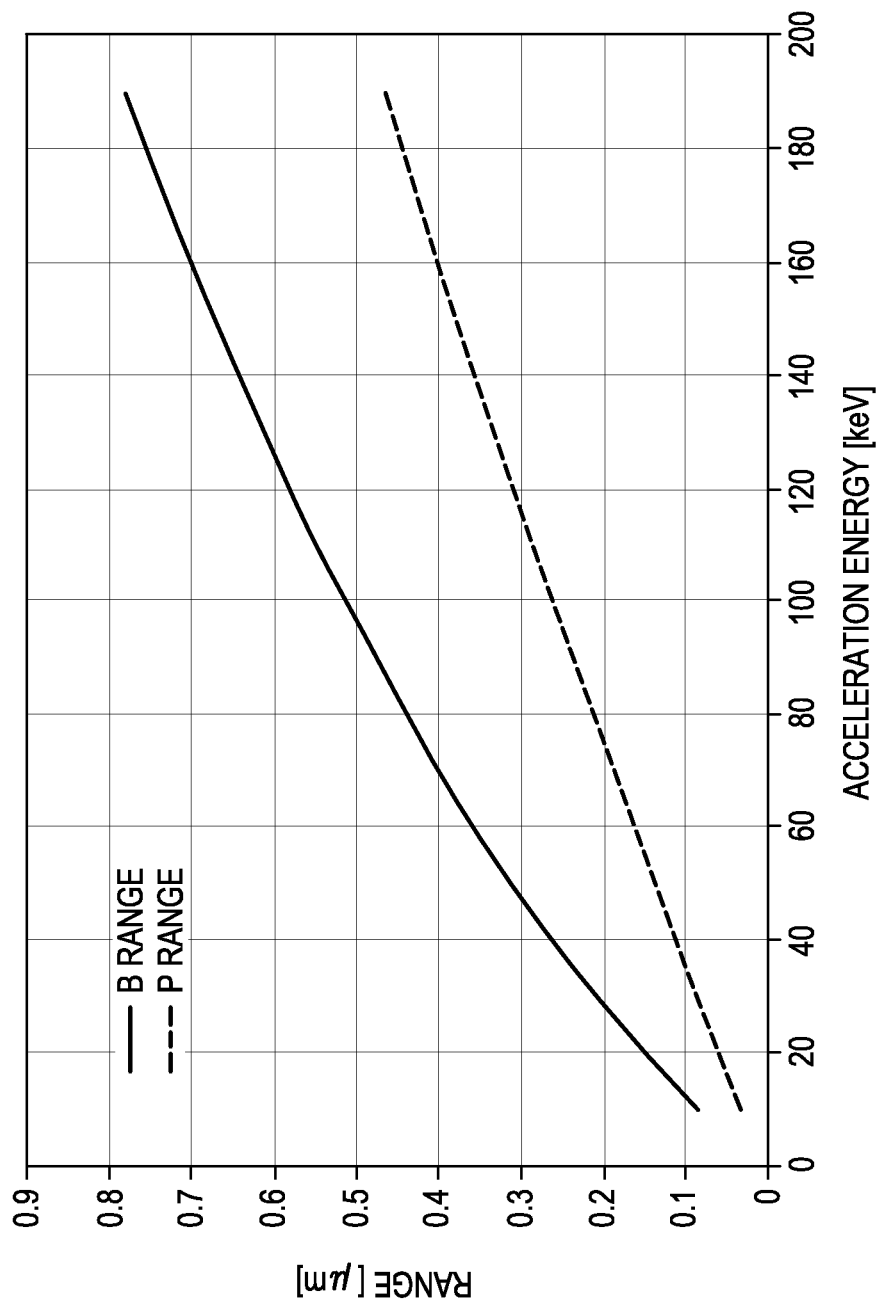
FIG. 5 is a characteristic diagram illustrating a relation between acceleration energy of ion implantation and a range of an impurity which has been implanted.
Figure 6:
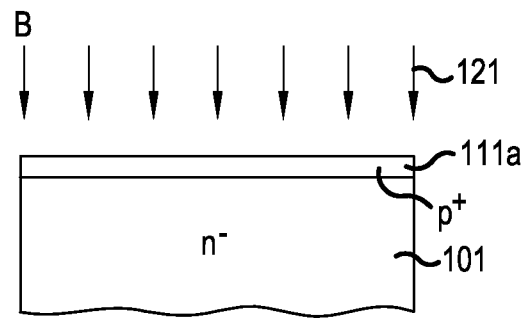
FIG. 6 is a sectional view illustrating a state on the way of manufacturing a semiconductor device according to a conventional art.
Figure 7:
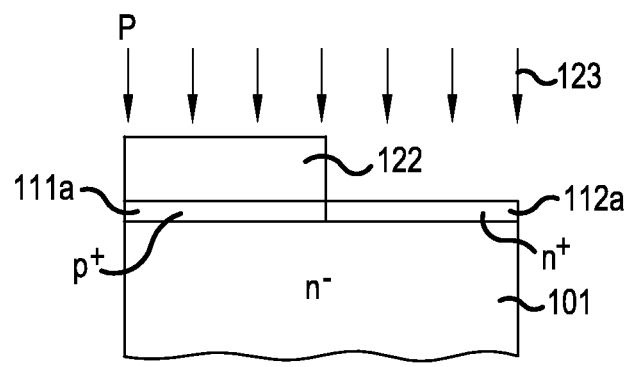
FIG. 7 is a sectional view illustrating another state on the way of manufacturing the semiconductor device according to the conventional art.
Figure 8:
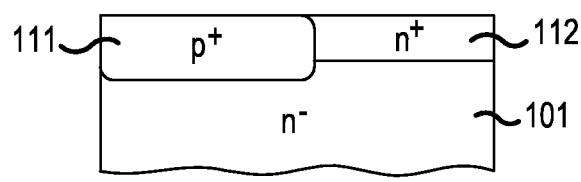
FIG. 8 is a sectional view illustrating still another state on the way of manufacturing the semiconductor device according to the conventional art.

The relationship between the range $(R_p+3 \cdot \Delta R_p)$ of an impurity implanted through ion implantation and the acceleration energy is illustrated in FIG. 5. FIG. 5 is a characteristic view illustrating the relationship between acceleration energy of ion implantation and a range of an impurity implanted. In FIG. 5, phosphorus is employed for the dopant (n-type impurity) of the first ion implanting process 31 and boron for the dopant (p-type impurity) of the second ion implanting process 33. As shown in FIG. 5, in the first ion implanting process 31, when the acceleration energy is set to 80 keV, the range of the n-type impurity is found to be about 0.21 μm. Then the acceleration energy of the ion implanting process 33 must be 30 keV or more so that the range of the p-type impurity in the second ion implanting process 33 becomes 0.21 μm or more. When employing arsenic or antimony as the dopant (n-type impurity) for the first ion implanting process 31, the acceleration energy of the second ion implanting process 33 can be also estimated as is the case for phosphorous as the dopant (n-type impurity) of the first ion implanting process 31.

As described above, according to the embodiment, the n+ impurity layer is formed by the first ion implanting process of the n-type impurity. Then performing the second ion implanting process of the p-type impurity using the resist mask can invert a part of the n+ impurity layer to the p-type, forming the p+ impurity layer. Conducting one patterning process for forming a resist mask can form the impurity layers having different conductivity types to each other with predetermined concentrations of the impurities on one principal surface of the n− semiconductor wafer even in the case that the impurity concentration of the p+ impurity layer becomes lower than that of the n+ impurity layer. This can lower the manufacturing costs in comparison with the conventional method conducting patterning processes twice for forming the resist masks. Further, the one patterning process for forming the resist mask permits miss alignment to decrease. Thus, eliminating the need for a design including the alignment error can prevent chip size from increasing.

Moreover, according to the embodiment, after forming the $n^+$ impurity layer, performing the second ion implanting process of a p-type impurity having smaller mass number than that of an n-type impurity by using a resist mask can invert a part of the $n^+$ impurity layer to the p-type, forming the $p^+$ impurity layer. This can lower the kinetic energy which the resist mask used for ion implantation has received in comparison with the case that the $p^+$ impurity layer is inverted to the n-type by implanting an n-type impurity. This can suppress a rise in temperature of a semiconductor wafer owing to ion implantation. Then this can suppress foaming and degassing from the resist mask, loss of vacuum in a chamber of an ion implanter, and sag of the resist mask pattern. Thus, this can control variation of the impurity dose, and then suppress yield deterioration.

Further, according to the embodiment, splitting the second ion implanting process of the p-type impurity using resist mask into two or more times can lessen the dose of the $p^+$ impurity implanted as a portion of split ion implantation in comparison with that implanted into the p-type impurity layer at the final stage. So this can lower the kinetic energy which the resist mask has received owing to the second ion implanting process. This can further suppress a rise in temperature of the semiconductor wafer owing to the second ion implanting process, even if the second ion implanting process is performed with the dose as high as $1.0 \times 10^{15}$ cm$^{-2}$, and even if the thickness of the semiconductor wafer is as thin as 200 μm or less.

Moreover, according to the embodiment, achieving the aim to suppress the sag of the resist mask pattern can eliminate the need to perform curing and baking to the resist mask patterned. Furthermore, the impurity ion impacting to the resist mask is a p-type one having smaller mass number than that of an n-type one, so that the damage given to the resist mask can be minimized. This can minimize a thickness of deteriorated layer formed by curing the surface layer of the resist mask. Suppressing the resist residue after ashing can control cross-contamination caused by an ion implanter that is contaminated. Therefore, yield deterioration can be suppressed not only for the semiconductor wafer under processing but also for the other semiconductor wafers which will be processed later.

Although the present invention has been described with an example for manufacturing a RC-IGBT, the present invention is applicable not only to the embodiment described above but also to semiconductor devices having an n-type semiconductor region and a p-type semiconductor region on one principal surface of a semiconductor wafer. Further, according to the embodiment described above, although the $n^-$ semiconductor wafer is ground at the back surface to form the back surface element structure after the front surface element structure has been completed, the $n^-$ semiconductor wafer may be ground at the back surface to form the back surface element structure on the way of manufacturing the front surface element structure. According to the embodiment described above, the front surface element structure with a planer gate is also preferable instead of that with a trench-gate.

As described above, the method of manufacturing the semiconductor device according to the present invention is useful for a power semiconductor device, in which the device thickness is thin, having at least an n-type semiconductor region and a p-type one on one principal surface of a semiconductor wafer.

Thus, a semiconductor device and a method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

EXPLANATION OF REFERENCE NUMERALS

1: $n^-$ drift layer, $n^-$ semiconductor wafer
2: p-base layer
3: $n^+$ emitter region
4: $p^+$ contact region
5: trench
6: gate oxide
7: gate electrode
8: emitter electrode
9: interlayer insulating film
10: n-FS layer
11: $p^+$ collector layer
11a: $p^+$ impurity layer
12: $n^+$ cathode layer
12a: $n^+$ impurity layer
13: collector electrode
14: short lifetime region
21: IGBT portion
22: FWD portion
31: ion implantation of n-type impurity (first ion implanting process)
32: resist mask
33: ion implantation of p-type impurity (second ion implanting process)

What is claimed is:

1. A method for manufacturing a semiconductor device comprising the steps of:
performing a first ion implanting process for implanting an n-type impurity with a first dose on a surface of a semiconductor wafer to form an n-type impurity layer on the surface of the semiconductor wafer;
coating resist on the surface of the side where the n-type impurity layer is formed in the semiconductor wafer;
exposing the semiconductor wafer selectively to pattern the resist; and
performing a second ion implanting process for implanting a p-type impurity with a second dose greater than the first dose using the remaining part of the resist as a mask to form a p-type impurity layer in the interior of the n-type impurity layer
wherein $R_p1$, $\Delta R_p1$, $R_p2$, and $\Delta R_p2$ are defined as the projected range of the n-type impurity in the first ion implanting process, the standard deviation of the projected range $R_p1$, the projected range of the p-type impurity in the second ion implanting process, and the standard deviation of the projected range $R_p2$, respectively, and wherein the following equation 1 is satisfied as:

$$R_p2 + 3 \cdot \Delta R_p2 \geq R_p1 + 3 \Delta R_p1 \qquad (1).$$

2. The method for manufacturing the semiconductor device according to claim 1, wherein the second ion implanting process is split into two or more times and is performed until the dose of the p-type impurity reaches the second dose, and wherein each dose of the ion implanting processes split into two or more times is less than the second dose.

3. The method for manufacturing the semiconductor device according to claim 1, wherein the method further includes heat treatment to activate the n-type impurity layer and the p-type impurity layer after the second ion implanting process, and wherein N1, N2, xj1, and xj2 are defined as the first dose, the second dose, the diffusion depth of the n-type impurity layer after heat treatment, and the diffusion depth of p-type impurity layer after heat treatment, respectively, wherein the following equation 2 is satisfied as:

$$N2 > N1 \cdot (xj2/xj1) \tag{2}$$

4. The method for manufacturing the semiconductor device according to claim 1, wherein the second dose of the p-type impurity layer is equal to or greater than $1.0 \times 10^{15}$ cm$^{-2}$.

5. The method for manufacturing the semiconductor device according to claim 1, wherein the method further includes a thinning process grinding a principal surface of the semiconductor wafer to reduce the thickness of the semiconductor wafer before the first ion implanting process, wherein the thinning process allows the thickness of the semiconductor wafer to be reduced to 200 μm or less, and wherein the first ion implanting process implants the n-type impurity on the surface of the semiconductor wafer which has been ground.

6. The method for manufacturing the semiconductor device according to claim 2, wherein the method further includes heat treatment to activate the n-type impurity layer and the p-type impurity layer after the second ion implanting process, and wherein N1, N2, xj1, and xj2 are defined as the first dose, the second dose, the diffusion depth of the n-type impurity layer after heat treatment, and the diffusion depth of p-type impurity layer after heat treatment, respectively, wherein the following equation 2 is satisfied as:

$$N2 > N1 \cdot (xj2/xj1) \tag{2}$$

7. The method for manufacturing the semiconductor device according to claim 2, wherein the second dose of the p-type impurity layer is equal to or greater than $1.0 \times 10^{15}$ cm$^{-2}$.

8. The method for manufacturing the semiconductor device according to claim 3, wherein the second dose of the p-type impurity layer is equal to or greater than $1.0 \times 10^{15}$ cm$^{-2}$.

9. The method for manufacturing the semiconductor device according to claim 2, wherein the method further includes a thinning process grinding a principal surface of the semiconductor wafer to reduce the thickness of the semiconductor wafer before the first ion implanting process, wherein the thinning process allows the thickness of the semiconductor wafer to be reduced to 200 μm or less, and wherein the first ion implanting process implants the n-type impurity on the surface of the semiconductor wafer which has been ground.

10. The method for manufacturing the semiconductor device according to claim 3, wherein the method further includes a thinning process grinding a principal surface of the semiconductor wafer to reduce the thickness of the semiconductor wafer before the first ion implanting process, wherein the thinning process allows the thickness of the semiconductor wafer to be reduced to 200 μm or less, and wherein the first ion implanting process implants the n-type impurity on the surface of the semiconductor wafer which has been ground.

11. The method for manufacturing the semiconductor device according to claim 4, wherein the method further includes a thinning process grinding a principal surface of the semiconductor wafer to reduce the thickness of the semiconductor wafer before the first ion implanting process, wherein the thinning process allows the thickness of the semiconductor wafer to be reduced to 200 μm or less, and wherein the first ion implanting process implants the n-type impurity on the surface of the semiconductor wafer which has been ground.

* * * * *